(12) United States Patent
Feldtkeller

(10) Patent No.: US 11,489,433 B2
(45) Date of Patent: Nov. 1, 2022

(54) METHOD FOR DRIVING AN ELECTRONIC SWITCH IN A POWER CONVERTER CIRCUIT AND POWER CONVERTER CIRCUIT

(71) Applicant: Infineon Technologies Austria AG, Villach (AT)

(72) Inventor: Martin Feldtkeller, Munich (DE)

(73) Assignee: Infineon Technologies Austria AG, Villach (AT)

( * ) Notice: Subject to any disclaimer, the term of this patent is extended or adjusted under 35 U.S.C. 154(b) by 295 days.

(21) Appl. No.: 16/835,660

(22) Filed: Mar. 31, 2020

(65) Prior Publication Data

US 2020/0321850 A1    Oct. 8, 2020

(30) Foreign Application Priority Data

Apr. 3, 2019 (EP) .................................... 19166973

(51) Int. Cl.
   *H02M 3/335*   (2006.01)
   *H02M 1/00*    (2006.01)
   *H02M 1/42*    (2007.01)

(52) U.S. Cl.
   CPC ........ *H02M 1/0025* (2021.05); *H02M 1/4225* (2013.01); *H02M 3/33507* (2013.01)

(58) Field of Classification Search
   CPC ..... H02M 1/0025; H02M 3/155–1588; H02M 3/335–42
   See application file for complete search history.

(56) References Cited

U.S. PATENT DOCUMENTS

| 9,647,562 B2 | 5/2017 | Hinz et al. | |
| 2015/0244275 A1* | 8/2015 | Hinz | H02M 1/08 363/21.17 |
| 2018/0054113 A1 | 2/2018 | Kim et al. | |

OTHER PUBLICATIONS

EP Search Report, EP 19 16 6973.8, dated Oct. 9, 2019, pp. 7.

* cited by examiner

*Primary Examiner* — Peter M Novak
(74) *Attorney, Agent, or Firm* — Armis IP Law, LLC

(57) ABSTRACT

A method for driving an electronic switch in a power converter and a power converter are disclosed. The method includes: driving an electronic switch (1) coupled to an inductor (2) in the power converter, wherein driving the electronic switch (1) includes driving the electronic switch (1) in a plurality of drive cycles by a drive signal ($S_{DRV}$). Driving the electronic switch (1) in at least one of the plurality of drive cycles includes: determining a desired duration ($T_{ON\_DES}$) of a current ($I_1$) through the switch (1); and adjusting a duration ($T_{DRV}$) of an on-level of the drive signal ($S_{DRV}$) dependent on the desired duration ($T_{ON\_DES}$) and a delay time ($T_{DEL}$) obtained in a preceding drive cycle. The delay time ($T_{DEL}$) is a time duration, in the preceding drive cycle, between a first time instance (t1) when the drive signal ($S_{DRV}$) changes from the on-level to an off-level and a second time instance (t2) when a current through the electronic switch (1) falls below a predefined threshold.

25 Claims, 12 Drawing Sheets

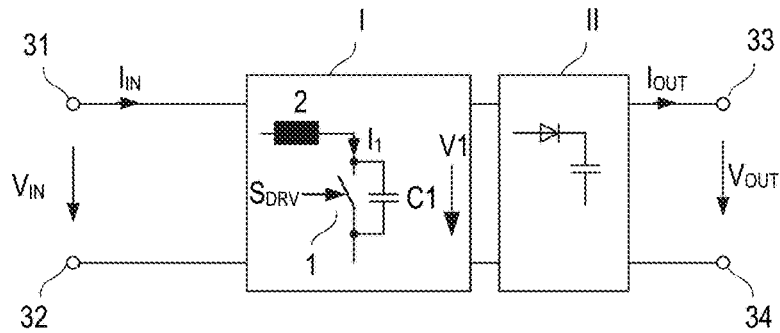
FIG 1
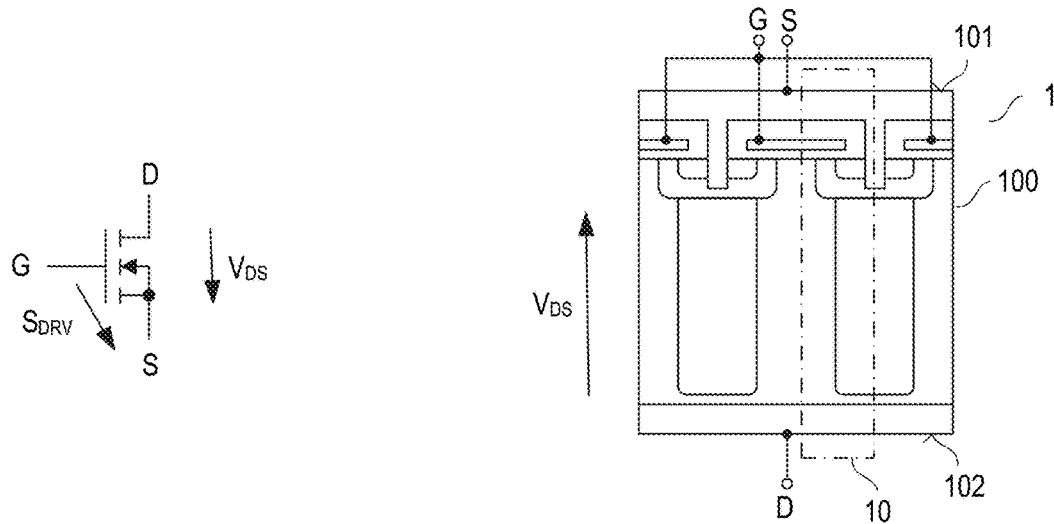
FIG 2A
FIG 2B
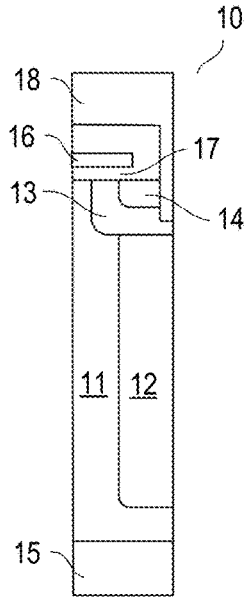
FIG 2C

METHOD FOR DRIVING AN ELECTRONIC SWITCH IN A POWER CONVERTER CIRCUIT AND POWER CONVERTER CIRCUIT

RELATED APPLICATION

This application claims priority to earlier filed European Patent Application Serial Number EP19166973.8 entitled "METHOD FOR DRIVING AN ELECTRONIC SWITCH IN A POWER CONVERTER CIRCUIT AND POWER CONVERTER CIRCUIT," filed on Apr. 3, 2019, the entire teachings of which are incorporated herein by this reference.

BACKGROUND

Conventional switched-mode power converter circuits are widely used for converting power in various kinds of electronic applications such as automotive, industrial, telecommunication, household or consumer electronic applications. A switched-mode power converter may include an electronic switch, an inductor coupled to the electronic switch, and a rectifier circuit coupled to the inductor. Converting power by a switched-mode power converter of this type usually includes driving the electronic switch in a plurality of successive drive cycles each including an on-time and an off-time, wherein the inductor receives energy from an input during the on-time and transfers energy to the rectifier circuit during the off-time. An output parameter, such as an output voltage or an output current, of the power converter may be regulated by suitably adjusting durations of the on-times and the off-times.

BRIEF DESCRIPTION OF EMBODIMENTS

Driving the electronic switch may include driving the electronic switch by a drive signal received at a drive input of the electronic switch, wherein the drive signal either has an on-level that switches on the electronic switch or an off-level that switches off the electronic switch. For various reasons, however, a duration of an on-level of the drive signal not necessarily equals a duration in which a current flows through the inductor and magnetizes the inductor. A parasitic output capacitance of the electronic switch, for example, may result in a deviation of the magnetization period from the desired magnetization period as defined by the drive signal. When the electronic switch switches off, for example, the parasitic output capacitance is charged when the transistor device is in a transient phase from an on-state to an off-state. Such charging of the output capacitance causes the current through the inductor to continue until the parasitic output capacitor has been charged. In some cases the energy that is additionally stored in the inductor in the transient phase from the on-state to the off-state is widely independent of the duration of the on-time and may cause problems in regulating the output parameter. Especially in power converters with a PFC (Power Factor Correction) such delay times caused by a parasitic output capacitance of the electronic switch may cause problems such as, for example, a significant THD (Total Harmonic Distortion).

One example of embodiments herein relates to a method. The method includes driving an electronic switch coupled to an inductor in a power converter, wherein driving the electronic switch includes driving the electronic switch in a plurality of drive cycles by a drive signal, wherein driving the electronic switch in at least one of the plurality of drive cycles includes: determining a desired duration of a current through the switch, and adjusting a duration of an on-level of the drive signal dependent on the desired duration and a delay time obtained in a preceding drive cycle. The delay time is a time duration, in the preceding drive cycle, between a first time instance when the drive signal changes from the on-level to an off-level and a second time instance when a current through the electronic switch falls below a predefined threshold.

Another example of embodiments herein relates to a power converter. The power converter includes an electronic switch coupled to an inductor, and a control circuit operable to drive the electronic switch in a plurality of drive cycles by a drive signal. The control circuit is operable in at least one of the plurality of drive cycles to determine a desired duration of a current through the switch, and adjust a duration of an on-level of the drive signal dependent on the desired duration and a delay time obtained in a preceding drive cycle. The delay time is a time duration between a first time instance when the drive signal changes from the on-level to an off-level and a second time instance when a current through the electronic switch falls below a predefined threshold.

Examples are explained below with reference to the drawings. The drawings serve to illustrate certain principles, so that only aspects necessary for understanding these principles are illustrated. The drawings are not to scale. In the drawings the same reference characters denote like features.

BRIEF DESCRIPTION OF FIGURES

FIG. 1 schematically illustrates one example of a power converter circuit that includes an inductor and an electronic switch coupled to the inductor according to embodiments herein;

FIGS. 2A to 2C show one example of the electronic switch implemented as a superjunction transistor device according to embodiments herein;

Figure 3:
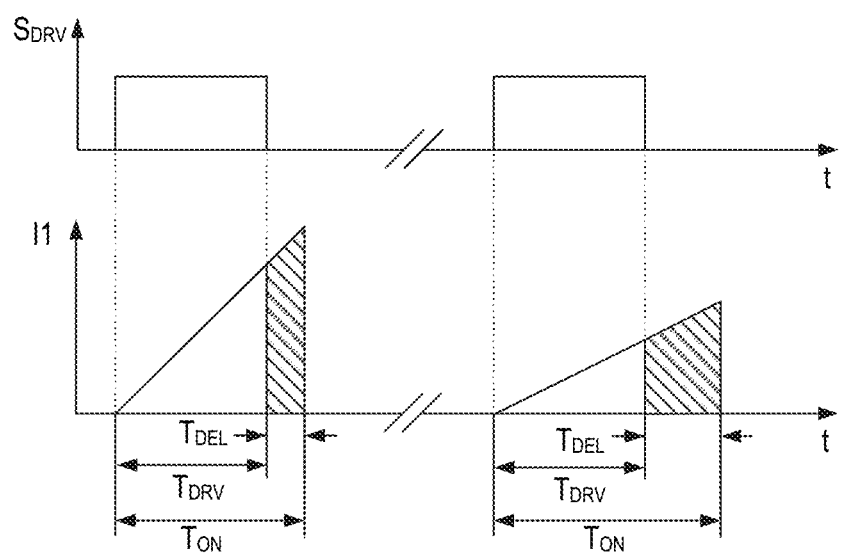
FIG. 3 shows waveforms of one example of a drive signal of the electronic switch and of a current through the electronic switch according to embodiments herein.

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

FIG. 1 schematically illustrates one example of a power converter circuit. This power converter circuit is operable to receive an input voltage $V_{IN}$ and an input current $I_{IN}$ at an input 31, 32 and provide an output voltage $V_{OUT}$ and an output current $I_{OUT}$ at an output 33, 34. The power converter may be operable to regulate an output parameter such as the output voltage $V_{OUT}$, the output current $I_{OUT}$, or an output power (which is given by the output voltage $V_{OUT}$ multiplied by the output current $I_{OUT}$) such that the output parameter has a predefined value. Further, the power converter may be operable to regulate a current waveform of the input current $I_{IN}$. This is explained in further detail herein below.

Referring to FIG. 1, the power converter includes a switching stage I connected to the input 31, 32 and a rectifier stage II connected between the switching stage I and the output 33, 34. The switching stage I includes an electronic switch 1 and an inductor 2 coupled to the electronic switch 1. The electronic switch 1 is controlled by a drive signal $S_{DRV}$ received at a drive input of the electronic switch 1 such that the electronic switch 1 switches on or off dependent on the drive signal $S_{DRV}$. According to one example, the inductor 2 is connected in series with a load path of the electronic switch 1 so that the same current $I_1$ flows through the electronic switch 1 and the inductor 2. The electronic switch 1 is operable to conduct a current when the drive signal $S_{DRV}$ switches on the electronic switch 1 (that is, when the drive signal $S_{DRV}$ drives the electronic 1 in an on-state) and is operable to block when the drive signal $S_{DRV}$ switches off the electronic switch 1 (that is, when the drive signal $S_{DRV}$ drives the electronic 1 in an off-state).

Any kind of electronic switch can be used to implement the electronic switch 1 in the power converter circuit shown in FIG. 1. According to one example, the electronic switch 1 is implemented as a transistor device. FIG. 2A shows a circuit symbol, FIG. 2B shows a vertical cross sectional view of one example of a transistor device, and FIG. 2C shows one detail of the transistor device shown in FIG. 2B. Referring to FIG. 2B, the transistor device includes a semiconductor body 100 and a plurality of transistor cells 10 integrated in the semiconductor body 100. Referring to FIG. 2C, which shows one transistor cell 10 in greater detail, each transistor cell 10 includes a drift region 11, a body region 13, a source region 14, and a drain region 15. The body region 13 is arranged between the drift region 11 and the source region 14, and the drift region 11 is arranged between the body region 13 and the drain region 15. The transistor device shown in FIGS. 2B and 2C is a superjunction transistor device. In this case, each transistor cell 10 further includes a compensation region 12 that adjoins the drift region 11 and the body region 13 and extends from the body region 13 along the drift region 11 towards the drain region 15.

As illustrated in FIGS. 2B and 2C, the transistor device may be implemented as a vertical transistor device so that the source region 14 of each transistor cell 10 is spaced apart from the drain region 15 in a vertical direction of the semiconductor 100. The "vertical direction" is a direction perpendicular to a first surface 101 and an opposite second surface 102 of the semiconductor body 100. However, implementing the transistor device as a vertical transistor device is only an example transistor device. The transistor device may as well be implemented as lateral transistor device, in which the source region 14 of each transistor cell 10 is spaced apart from the drain region 15 in a lateral direction of the semiconductor 100. The "lateral direction" is a direction parallel to the first surface 101 and the second surface 102.

Referring to FIGS. 2B and 2C, each transistor cell 10 further includes a gate electrode 16 arranged adjacent to the body region 13 and dielectrically insulated from the body region 13 by a gate dielectric 17. The gate electrode 16 serves to control a conducting channel in the body region 13 between the source region 14 and the drift region 11. Just for the purpose of illustration, the gate electrode 16 is a planar electrode that is arranged above the first surface 101 of the semiconductor body 100 in the example illustrated in FIGS. 2B and 2C. This, however, is only an example. The gate electrode may also be implemented as a trench electrode that is arranged in a trench extending from the first surface 101 into the semiconductor body 100.

Referring to FIG. 2B, the gate electrodes 16 of the individual transistor cells are connected to a gate node G and the body and source regions 13, 14 of the individual transistor cells 10 are connected to a source metallization 18, wherein the source metallization 18 forms a source node or is connected to a source node S. Further, the drain regions 15 of the individual transistor cells 10 are connected to a drain node D of the transistor device. Referring to FIG. 2B, the drain regions 15 of the plurality of the transistor cells 10 may be formed by one common doped semiconductor region, and the drift regions 11 of the plurality of transistor cells 10 may be formed by one common doped semiconductor region. Further, the compensation regions 12, body regions 13 and source regions 14 of two or more adjacent transistor cells 10 can be formed by one respective semiconductor region.

The transistor device can be implemented as an n-type transistor device (the circuit symbol shown in FIG. 2A represents an n-type transistor device) or as a p-type transistor device. In an n-type transistor device, the source regions 14, the drift regions 11 and the drain regions 15 are n-type semiconductor regions and the body regions 13 and the compensation regions 12 are p-type semiconductor regions. In a p-type transistor device, the doping type of the individual semiconductor regions is complementary to the doping type of the corresponding semiconductor regions in an n-type transistor device.

In a transistor device of the type illustrated in FIGS. 2A-2C a drive input is formed by the gate node G and the source node S, wherein the transistor device switches on or off dependent on a voltage level of a drive voltage received between the gate node G and the source node S. That is, when the electronic switch 1 shown in FIG. 1 is implemented as a transistor device, the drive signal $S_{DRV}$ is a voltage between the gate node G and the source node S (wherein this voltage is often referred to as gate-source voltage). The load path of the transistor device is an internal path between the drain node D and the source node S. The transistor device is in an on-state, when the drive voltage $S_{DRV}$ is higher than a threshold voltage of the transistor device, and the transistor device is in an off-state, when the drive voltage $S_{DRV}$ is below the threshold voltage. In an n-type transistor device, for example, the threshold voltage is a positive voltage.

When the transistor device is in the on-state there is a conducting channel in the body region 13 of each transistor cell 10 between the source region 14 and the drift region 11 so that a current can flow between the drain node D and the source node S through the transistor device. In the off-state, the conducting channel in the body region 13 is interrupted so that a current flow between the drain node D and the source node S is prevented (when a polarity of a drain-source voltage $V_{DS}$ applied between the drain node D and the source node S is such that a pn-junction between the drift region 11 and the body region 13 is reverse biased). The drift region 11 and the body region 13 and, mainly, the drift region 11 and the compensation region 12 of each transistor cell 10 form a junction capacitance. This junction capacitance is represented by a capacitor C1 connected in parallel with the load path of the electronic switch 1 shown in FIG. 1. This junction capacitance is charged when the electronic switch 1 switches off and the drain-source voltage $V_{DS}$ increases and is discharged when the electronic switch 1 switches on again.

Operating a power converter of the type illustrated in FIG. 1 may include driving the electronic switch 1 in a plurality of successive drive cycles, wherein each drive cycle includes switching on the electronic switch 1 for a predefined duration. In order to be able to precisely regulate the desired output parameter of the power converter such as the output current $I_{OUT}$, the output voltage $V_{OUT}$, or the output power it is important that the duration in which a current flows through the electronic switch 1 can be precisely controlled. By controlling the current $I_1$ through the electronic switch 1 an instantaneous input power of the power converter can be controlled, wherein by controlling the instantaneous input power one of the output parameters can be controlled. A large output capacitance of the electronic switch 1, such as a large output capacitance that inevitably exists in a superjunction transistor device may counteract a precise control of the duration of the current flow. This is explained with reference to FIG. 3 in the following.

FIG. 3 schematically illustrates signal waveforms of the drive signal $S_{DRV}$ and of the current $I_1$ through the electronic switch 1. The drive signal $S_{DRV}$ either has an on-level that switches on the electronic switch 1 or an off-level that switches off the electronic switch 1. Just for the purpose of illustration, the on-level is a high signal level and the off-level is a low signal level in the example illustrated in FIG. 3. FIG. 3 illustrates two successive drive cycles, wherein in each of these drive cycles the drive signal $S_{DRV}$ has the on-level for a predefined duration $T_{DRV}$. A current different from zero flows through the electronic switch 1 during the duration $T_{DRV}$ in which the drive signal $S_{DRV}$ has the on-level and, additionally, during a delay time $T_{DEL}$ after the signal level of the drive signal $S_{DRV}$ has changed from the on-level to the off-level. It should be noted that FIG. 3 schematically illustrates the relationship between the drive signal $S_{DRV}$ and the current $I_1$ through the electronic switch 1. In reality there is a (short) delay time between a time instance when the signal level of the drive signal $S_{DRV}$ changes from the off-level to the on-level and a time instance when the current I1 through the electronic switch 1 starts to flow. This delay time, however, is not illustrated in FIG. 3.

The delay time $T_{DEL}$ in which he current $I_1$ continues to flow after the drive signal $S_{DRV}$ has changed to the off-level is due to charging the output capacitance C1. That is, the electronic switch 1 switches off when the signal level of the drive signal $S_{DRV}$ changes from the on-level to the off-level, but the current I1 through the electronic switch 1 continues to flow and charges the output capacitance C1. In a superjunction transistor device, for example, a capacitance value of the output capacitance C1 is dependent on the drain-source voltage $V_{DS}$ and exponentially decreases as the drain-source voltage $V_{DS}$ increases. In a modern superjunction transistor device, for example, a capacitance value of the output capacitance is reduced by more than two orders of magnitude as the drain-source voltage increases from 0V to about 30V, wherein the voltage blocking capability can be several hundred volts such as 600V or 800V. Thus, when the electronic switch 1 is implemented with a superjunction transistor device the current through the electronic switch 1 (and the inductor 2) essentially continuous to flow until the drain-source voltage $V_{DS}$ has reached a voltage level at which the capacitance value of the output capacitance is significantly reduced.

Because the delay time $T_{DEL}$ in which the current through the electronic switch 1 continuous to flow is due to charging the output capacitance C1, a duration of this delay time $T_{DEL}$ is dependent on a magnitude of the current $I_1$ after the drive signal $S_{DRV}$ has changed to the off-level. Basically, the lower the magnitude of the current $I_1$ when the drive signal $S_{DRV}$ changes to the off-level, the longer the duration $T_{DEL}$ of the delay time. This is illustrated in FIG. 3. In FIG. 3 the areas drawn in dashed lines represent the charge that is stored in the output capacitance C1 as the current $I_1$ flows during the delay time $T_{DEL}$. This charge is essentially the same in each drive cycle and essentially dependent on the capacitance value of the output capacitance C1.

In the example illustrated in FIG. 3, the switch current $I_1$ essentially linearly increases after the drive signal $S_{DRV}$ switches on the electronic switch 1. This may be obtained by connecting the inductor 2 in series with the electronic switch 1 and by connecting the series circuit including the electronic switch 1 and the inductor 2 between a first input node 31 and a second input node 32 of the input 31, 32. In this case, a slope ($dI_1/dt$) of the switch current $I_1$ is essentially proportional to the input voltage $V_{IN}$ ($dI_1/dt \approx V_{IN}/L$, where L is the inductance of the inductor 2). In this case, at a given duration $T_{DRV}$ of the on-level of the drive signal $S_{DRV}$, the current level of the switch current $I_1$ at the time instance when the drive signal $S_{DRV}$ changes from the on-level to the off-level and, consequently, the current level after this time instance is dependent on the input voltage $V_{IN}$. Consequently, in this case, the duration $T_{DEL}$ of the delay time is dependent on the input voltage $V_{IN}$.

Figure 4:
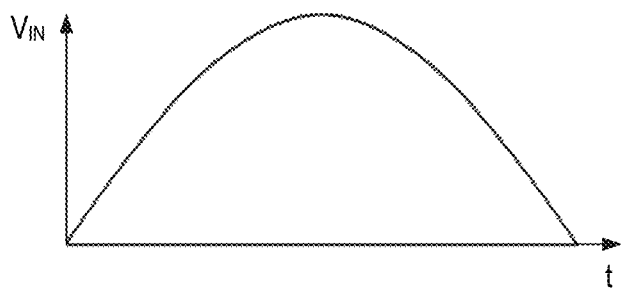
FIG. 4 shows a relationship between a magnitude of an input voltage of the power converter circuit and a duration of a delay time illustrated in FIG. 3 according to embodiments herein.
Figure 4:
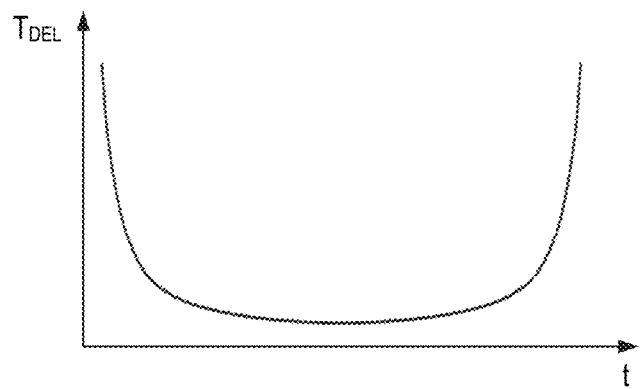

This is schematically illustrated in FIG. 4 which illustrates a varying input voltage $V_{IN}$ and a corresponding variation of the delay time duration $T_{DEL}$. As can be seen from FIG. 4, the delay time duration $T_{DEL}$ increases as the input voltage $V_{IN}$ decreases. Just for the purpose of illustration, the input voltage $V_{IN}$ illustrated in FIG. 4 is one half period of a sinusoidal voltage. A frequency of the sinusoidal voltage is 50 Hz or 60 Hz, for example. Further, the switching frequency, that is, the frequency at which the drive cycles are generated is higher than 10 kHz, so that several hundred drive cycles may be generated within the time period illustrated in FIG. 4.

The delay time in which the switch current $I_1$ continuous to flow may cause severe problems especially in a power converter that receives an alternating input voltage, such as a sinusoidal input voltage or a rectified sinusoidal input voltage. There is therefore a need to drive the electronic switch 1 in such a way that a duration $T_{ON}(=T_{DRV}+T_{DEL})$ in which the current L flows through the electronic switch 1 can be precisely adjusted. One example of a method that is suitable to drive the electronic switch in this way is illustrated in FIG. 5.

Figure 5:
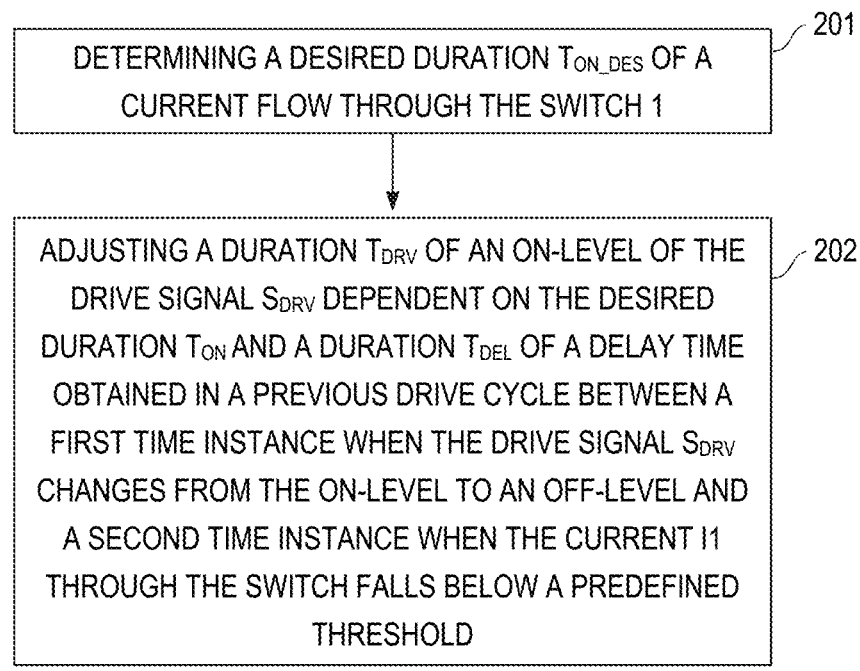
FIG. 5 shows one example of a method for driving the electronic switch, wherein the method includes a time delay compensation according to embodiments herein.

FIG. 5 illustrates a flowchart of one example of a method for driving the electronic switch 1. Referring to FIG. 5, this method includes (see 201) determining a desired duration $T_{ON\_DES}$ of a current flow through the switch 1 (see 201 in FIG. 5). This duration $T_{ON\_DES}$ is referred to as desired current flow duration in the following. The method further includes (see 202) adjusting a duration $T_{DRV}$ of an on-level of the drive signal $S_{DRV}$ dependent on the desired current flow duration $T_{ON\_DES}$ and a duration $T_{DEL}$ of a delay time obtained in a previous drive cycle, wherein the delay time is a time between a first time instance when the drive signal $S_{DRV}$ changes from the on-level to the off-level and a second time instance when the current $I_1$ through the switch 1 falls below a predefined threshold. The duration $T_{DRV}$ of the on-level of the drive signal $S_{DRV}$ is referred to as on-level duration $T_{DRV}$ in the following, and the duration $T_{DEL}$ of the delay time is referred to as delay time duration in the following.

Figure 6:
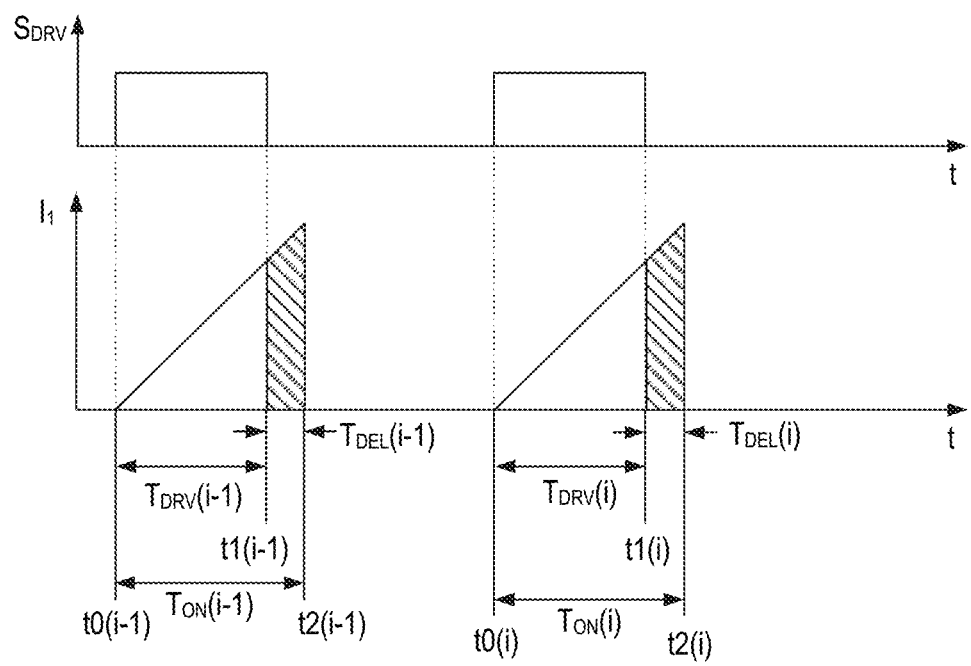
FIG. 6 shows waveforms of the drive signal of the electronic switch and the current through the switch when the electronic switch is operated in accordance with the method illustrated in FIG. 5 according to embodiments herein.

The method according to FIG. 5 is explained with reference to FIG. 6 in the following. FIG. 6 illustrates driving the electronic switch 1 based on the drive signal $S_{DRV}$ in two successive drive cycles i−1, i. In each of these drive cycles, the drive signal $S_{DRV}$ has the on-level for a predefined on-level duration $T_{DRV}$; the drive signal changes from the on-level to the off-level at a first time instance t1; and the switch current $I_1$ continuous to flow for a delay time duration $T_{DEL}$ after the first time instance. The delay time duration $T_{DEL}$ ends at a second time instance t2 when the switch current $I_1$ falls below a predefined threshold. In FIG. 6, t0 denotes a time instance when the respective drive cycle starts, that is, when the drive signal $S_{DRV}$ changes from the off-level to the on-level, and $T_{ON}$ denotes the current flow duration. Further, i−1 denotes a first one of the two drive cycles illustrated in FIG. 6 and i denotes a second one of the drive cycles illustrated in FIG. 6, wherein the second drive cycle follows the first drive cycle. Equivalently, (i−1) denotes the time durations and time instances associated with the first drive cycle i−1 and (i) denotes the time instances and time durations associated with the second drive cycle i.

Referring to FIGS. 5 and 6 the method includes determining a desired current flow duration $T_{ON\_DES}(i)$ in the second drive cycle i, determining the delay time duration $T_{DEL}$ (i−1) in the first drive cycle i−1 and adjusting the on-level duration $T_{DRV}(i)$ in the second drive cycle i dependent on the desired on-time duration $T_{ON\_DES}(i)$ and the determined delay time duration $T_{DEL}$ (i−1) in the first drive cycle i−1. According to one example, the on-level duration $T_{DRV}(i)$ in one drive cycle i is given by the desired current flow duration $T_{ON\_DES}(i)$ in this drive cycle minus the delay time duration $T_{DEL}(i-1)$ in the preceding drive cycle $T_{DEL}$ (i−1), $$T_{DRV}(i)=T_{ON\_DES}(i)-T_{DEL}(i-1) \quad (1a).$$

The "preceding drive cycle" may be the drive cycle directly preceding the drive cycle i in which the on-level duration $T_{DRV}(i)$ is to be adjusted or may a drive cycle that is before the directly preceding the drive cycle, so that $$T_{DRV}(i)=T_{ON\_DES}(i)-T_{DEL}(i-n) \quad (1b),$$

where n is an integer greater than 0 (n>0).

The delay time duration $T_{DEL}$ may be determined in each drive cycle and be used in a succeeding drive cycle to adjust the on-level flow duration $T_{DRV}$. However, it is also possible to determine the delay time duration $T_{DEL}$ in less than each drive cycle and use the delay time duration $T_{DEL}$ determined in one drive cycle to adjust the on-level duration in two or more drive cycles based on the same delay time duration $T_{DEL}$ and an individual current flow duration.

Referring to FIG. 6, the current flow duration $T_{ON}(i)$ in the second drive cycle i is essentially given by the on-level duration $T_{DRV}(i)$ plus the delay time duration $T_{DEL}(i)$ in the second drive cycle i. This current flow duration $T_{ON}(i)$ essentially equals the desired current flow duration $T_{ON\_DES}$ (i) because, for the reasons outlined below, it can be assumed that the delay time duration $T_{DEL}(i)$ in the second drive cycle i essentially equals the delay time duration $T_{DEL}(i-1)$ (or $T_{DEL}(i-n)$) in the preceding drive cycle, that is, $T_{DEL}(i) \approx T_{DEL}(i-1)(T_{DEL}(i) \approx T_{DEL}(i-n))$.

The delay time duration may be dependent on the input voltage $V_{IN}$, but may also be dependent on other parameters. It can be assumed that these parameters that affect the delay time duration change slowly relative to the duration of one drive cycle and that the desired current flow duration $T_{ON\_DES}$ (at least in a steady state of the power converter) at most slightly changes from drive cycle to drive cycle. Based on this, it can be assumed that the delay time duration $T_{DEL}$ at most slightly changes from drive cycle to drive cycle. Thus by adjusting the on-level duration $T_{DRV}(i)$ in one drive cycle i based on the desired on-time duration $T_{ON\_DES}(i)$ and the delay time duration $T_{DEL}(i-1)$ ($T_{DEL}(i-n)$) in a preceding drive cycle i−1 (i−n) causes the current flow duration $T_{ON}(i)$ to be essentially to the desired current flow duration $T_{ON\_DES}(i)$. A significant error may only occur in a very first drive cycle.

Figure 7:
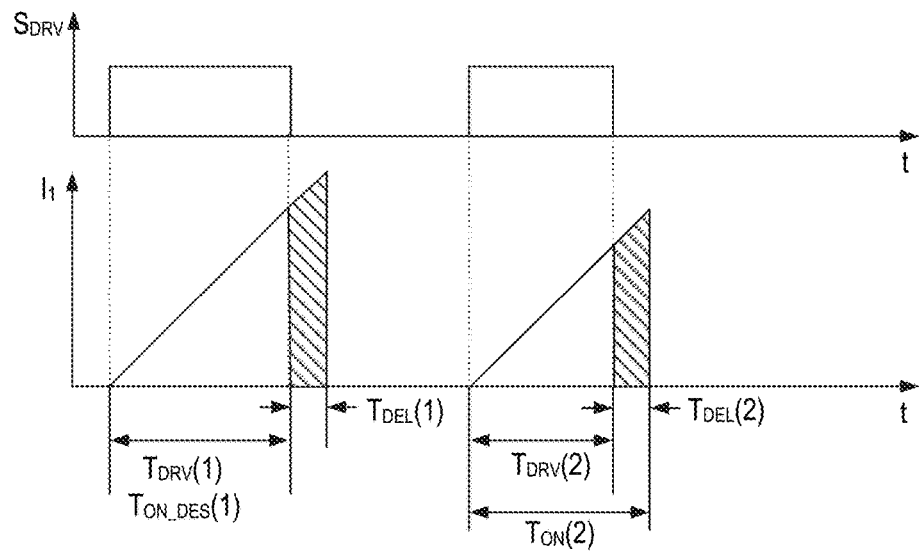
FIG. 7 shows waveforms of the method according to FIGS. 5 and 6 in a first and a second drive cycle (after start-up of the power converter circuit) according to embodiments herein.

Referring to FIG. 7, in a very first drive cycle 1 the on-level duration $T_{DRV}(1)$ may be adjusted such that it is equal to the desired current flow duration $T_{ON\_DES}(1)$. In this case, the switch current flows during the desired current flow duration $T_{ON\_DES}(1)$ plus the delay time duration $T_{DEL}(1)$, which is longer than desired. In a second drive cycle 2, however, the delay time duration $T_{DEL}(1)$ determined in the first drive cycle 1 is considered for adjusting the on-level duration $T_{DRV}(2)$ such that the on-level duration $T_{DRV}(2)$ is given by the desired current flow duration $T_{ON\_DES}(2)$ minus the delay time duration $T_{DEL}(1)$ obtained in the first drive cycle 1. Assuming that the delay time duration $T_{DEL}(2)$ in the second drive cycle essentially equals the delay time duration $T_{DEL}(1)$ in the first drive cycle 1 the current flow duration $T_{ON}(2)$ in the second drive cycle essentially equals the desired current flow duration $T_{ON\_DES}(2)$.

Figure 8:
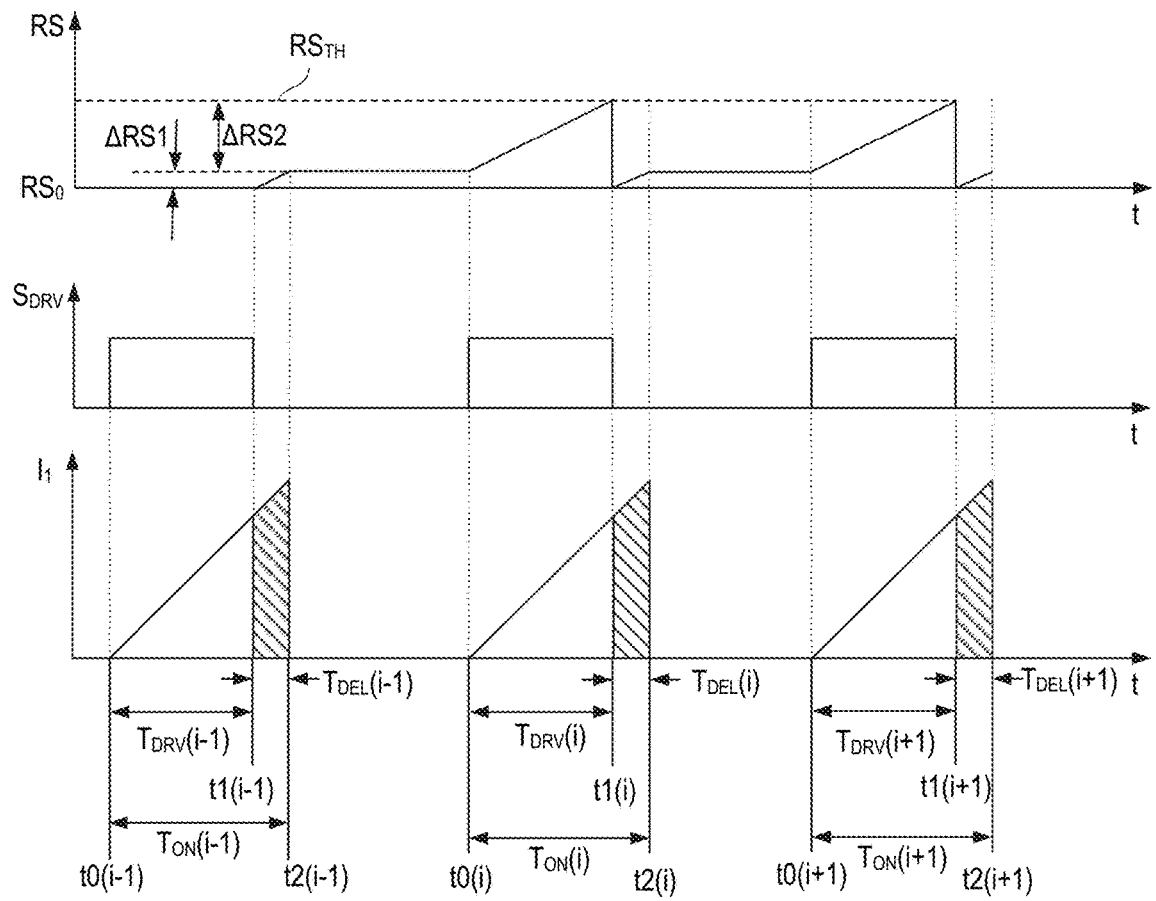
FIG. 8 shows signal waveforms of the drive signal, the current through the switch and a ramp signal that illustrate one example for achieving the time delay compensation according to embodiments herein.

One example of a method for determining the delay time duration $T_{DEL}$ in one drive cycle and adjusting the on-level duration $T_{DRV}$ based on a desired current flow duration and the determined delay time duration in a successive drive cycle is illustrated in FIG. 8. FIG. 8 schematically shows timing diagrams of the drive signal $S_{DRV}$ the switch current $I_1$ and a ramp signal RS, wherein the ramp signal RS is used for determining the delay time duration $T_{DEL}$ and adjusting the on-level duration $T_{DRV}$. FIG. 8 illustrates driving the electronic switch 1 in three successive drive cycles i−1, i, i+1.

Referring to FIG. 8, the ramp signal RS starts to increase at the first time instance t1 in each drive cycle beginning at a start value (initial value) $RS_0$. The initial value $RS_0$ is zero (0), for example. A slope of the ramp signal RS is predefined and fixed according to one example. Further, the ramp signal RS stops to increase at the second time instance t2, remains on the level it has reached by increasing between the first and second time instance t1, t2, and further increases at the beginning t0 of a new drive cycle, that is, when the drive signal $S_{DRV}$ changes from the off-level to the on-level, until the ramp signal RS reaches a ramp signal threshold $RS_{TH}$. When the ramp signal RS reaches the threshold $RS_{TH}$ at the first time instance t1 it is rapidly reset to the start value $RS_0$ and again starts to increase until the switch current $I_1$ falls below the predefined threshold at the second time instance t2. The time instance when the ramp signal RS reaches the threshold $RS_{TH}$ defines the first time instance t1 in the respective cycle i.

In the method illustrated in FIG. 8, the slope of the ramp signal RS and the threshold signal $RS_{TH}$ define the desired current flow duration, wherein the current flow duration $T_{ON}$ is essentially given by $$T_{ON\_DES} = \frac{RS_{TH} - RS_0}{m_{RS}}, \quad (2)$$

where $m_{RS}=dRS(t)/dt$ denotes the slope of the ramp signal RS. In this method, the ramp signal RS in each drive cycle starts to increase at the start value $RS_0$ at the first time instance t1. In each drive cycle, a signal level of the ramp signal RS at the end of the delay time duration $T_{DEL}$ is by ΔRS1 higher than the initial value $RS_0$, wherein ΔRS1 is proportional to the delay time duration $T_{DEL}$. The time duration it takes for the ramp signal RS to increase from this signal level $RS_0$+ΔRS1 to the threshold $RS_{TH}$ in the next drive cycle is proportional to a value ΔRS2 that is given by the threshold $RS_{TH}$ minus the signal level $RS_0$-ΔRS1 of the ramp signal RS at the end of the delay time duration $T_{DEL}$, ΔRS2=$RS_{TH}$-($RS_0$-ΔRS1). Thus, the longer the delay time duration $T_{DEL}$ and, therefore, the higher the signal level $RS_0$+ΔRS1 the ramp signal RS reaches at the end of the delay time duration $T_{DEL}$ the shorter the on-level duration $T_{DRV}$ in the next drive cycle.

Referring to FIG. 8, the ramp signal RS is reset to the start value $RS_0$ after it has reached the threshold $RS_{TH}$. Referring to the above, the time instance at which the ramp signal RS reaches the threshold $RS_{TH}$ defines the first time instance t1 in the respective cycle i at which the drive signal $S_{DRV}$ changes from the on-level to the off-level and at which the delay time duration $T_{DEL}$ begins. In order to be able to precisely determine the delay time duration $T_{DEL}$ by using the ramp signal RS it is important that the ramp signal RS is rapidly reset to the initial value $RS_0$ after it has reached the threshold $RS_{TH}$. The ramp signal RS may be generated in various ways.

According to one example, the ramp signal RS is generated using a digital counter that counts in accordance with a clock signal, wherein the ramp signal is a counter reading of the digital counter. Such counter can be rapidly reset so that a ramp signal RS of the type illustrated in FIG. 8 can easily be generated using a digital counter.

According to another example, the ramp signal RS may be generated using a capacitor that is charged by a current source, wherein the ramp signal RS is a voltage across the capacitor. In this example, "resetting the ramp signal RS" may include discharging the capacitor. Discharging a capacitor, however, may take some time so that in this case the ramp signal RS not necessarily rapidly decreases from the threshold $RS_{TH}$ to initial start value $RS_0$. According to one example, two ramp signal RS11, RS12 may therefore be used in the method for controlling the electronic switch 1. This is illustrated in FIG. 9.

Figure 9:
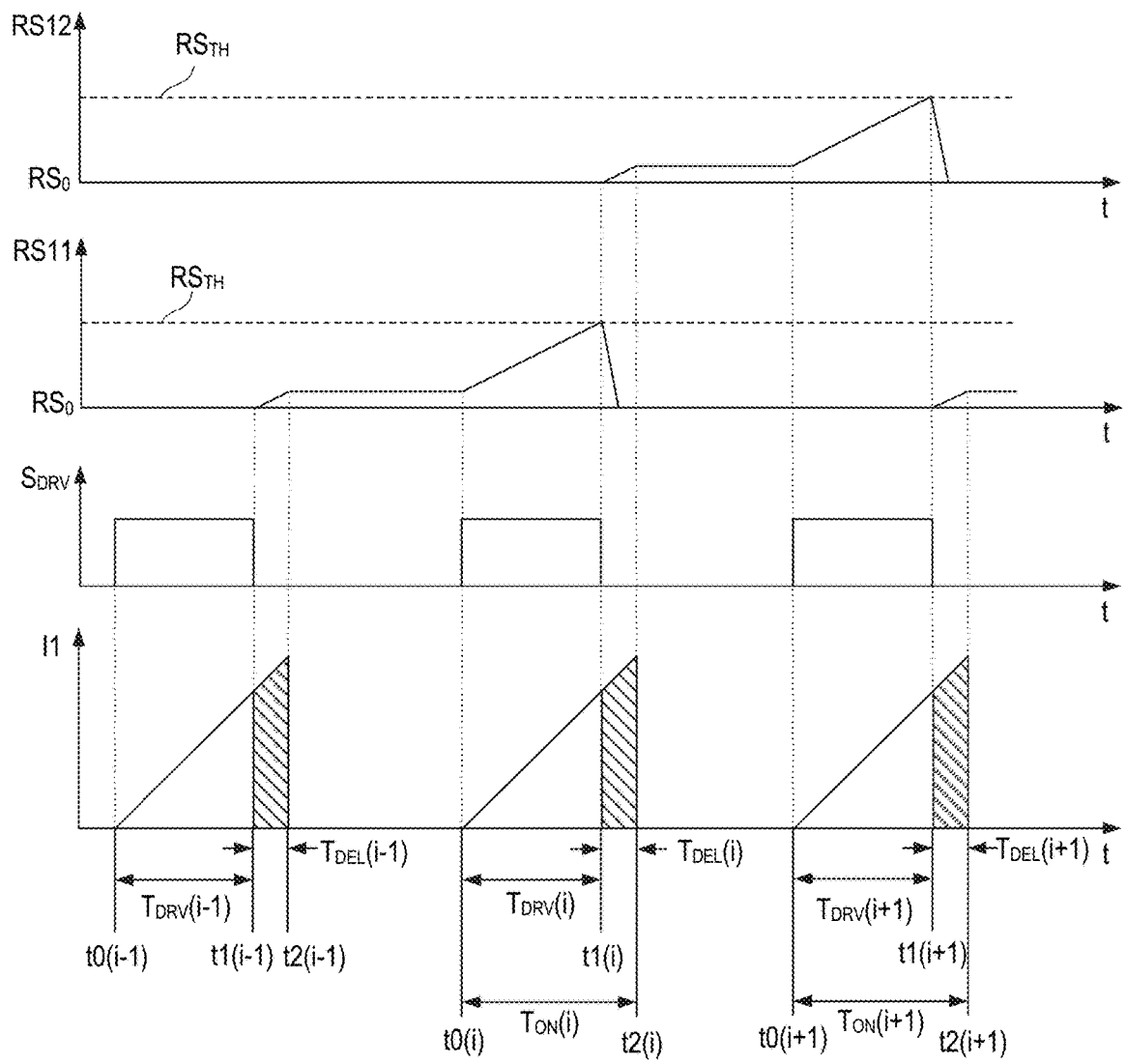
FIG. 9 shows signal waveforms that illustrate a modification of the method illustrated in FIG. 8 according to embodiments herein.

FIG. 9 shows signal waveforms of the drive signal $S_{DRV}$, the switch current $I_1$, a first ramp signal RS11 and a second ramp signal RS12. The function of these ramp signals RS11, RS12 is the same as the function of the ramp signal RS illustrated in FIG. 8. In the example illustrated in FIG. 9, however, it is not necessary that the ramp signals RS11, RS12 are rapidly reset to the start value $RS_0$ after they have reached the threshold $RS_{TH}$ because the two ramp signals RS11, RS12 are alternatingly used to determine the delay time duration $T_{DEL}$ in one drive cycle and adjust the on-level duration $T_{DRV}$ in the next drive cycle. That is, each time one of the two ramp signals RS11, RS12 reaches the threshold $RS_{TH}$, the other one of the two ramp signals RS11, RS12 starts to increase at the start value $RS_0$. In this way, the ramp signal that has reached the threshold $RS_{TH}$ may slowly decrease to the start value $RS_0$, wherein it should have reached the start value $RS_0$ before the other ramp signal reaches the threshold $RS_{TH}$ in the next drive cycle. More specifically, in the example illustrated in FIG. 9, the first ramp signal RS11 determines the delay time duration $T_{DEL}$ (i−1) in a first drive cycle i−1 and adjusts the on-level duration $T_{DRV}$(i) in a second drive cycle i, and the second ramp signal RS12 is used to determine the delay time duration $T_{DEL}$(i) in the second drive cycle i and to adjust the on-level duration $T_{DRV}$(i+1) in a third drive cycle (i+1), wherein the first ramp signal RS11 is again used in the third drive cycle i+1 to determine the delay time duration $T_{DEL}$ (i+1).

Figure 10:
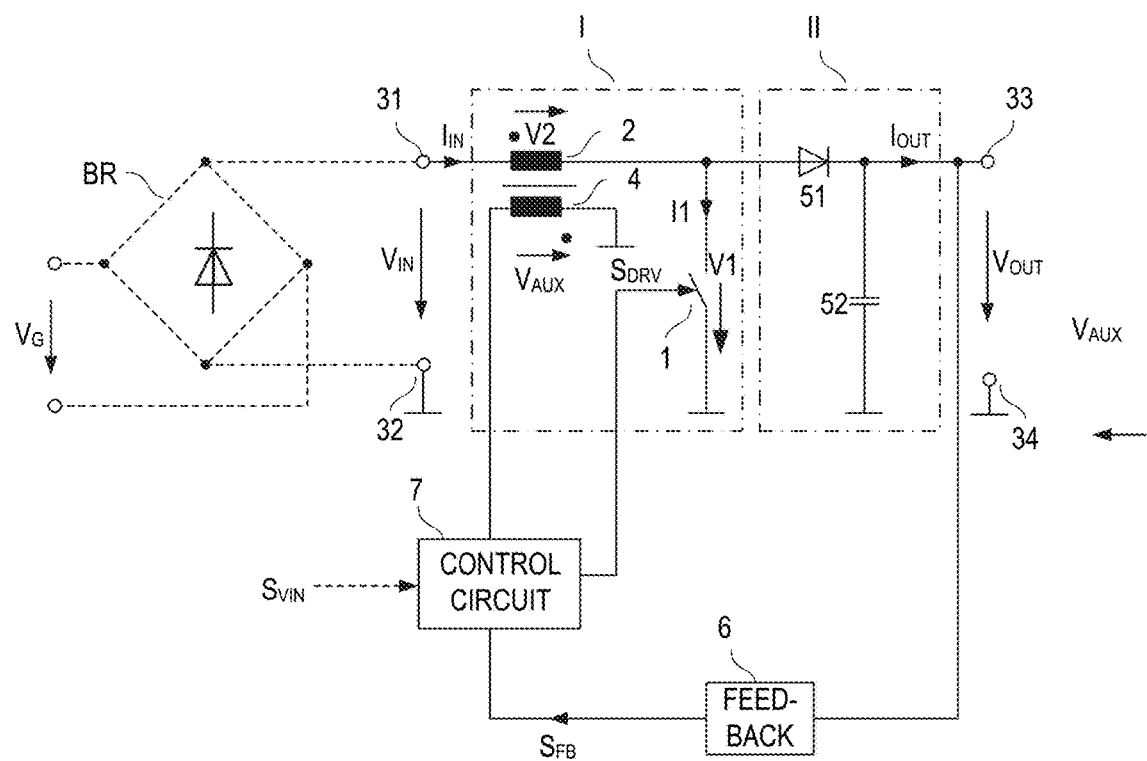
FIG. 10 illustrates one example of a power converter circuit that is implemented as a boost converter according to embodiments herein.

FIG. 10 shows one example of a power converter in greater detail. In this example, the power converter is implemented as a boost converter with a non-isolated topology. In this power converter, a series circuit including the electronic switch 1 and the inductor 2 is connected between the first input node 31 and the second node 32. The rectifier stage II is connected between a circuit node common to the electronic switch 1 and the inductor 2 and the output 33, 34. The rectifier stage II may include a series circuit with a rectifier element 51, such as a diode, and a capacitor 52, wherein the series circuit is connected in parallel with the electronic switch 1. The output voltage $V_{OUT}$ is available across the capacitor 52 in this example. Implementing the rectifier stage II in this way, however, is only an example. The rectifier stage II may be implemented in various other ways and may, for example, include a further inductor. Rectifier stages in boost converters are commonly known, so that no further explanations are required in this regard.

Referring to FIG. 10, the power converter further includes a control circuit 7. The control circuit is operable to generate the drive signal $S_{DRV}$ received by the electronic switch 1. According to one example, the control circuit 7 is operable to drive the electronic switch 1 in such a way that an output parameter, such as the output voltage $V_{OUT}$ or the output current $I_{OUT}$, of the power converter is regulated. For this, the control circuit 7 receives a feedback signal $S_{FB}$ that is dependent on the regulated output parameter. The feedback signal $S_{FB}$ is generated by a feedback circuit 6 dependent on the regulated output parameter, wherein the feedback signal 6 receives a signal that represents the respective output parameter. Just for the purpose of illustration, in the example shown in FIG. 10, the regulated output parameter is the output voltage $V_{OUT}$ so that the feedback signal 6 receives the output voltage $V_{OUT}$ in this example. Alternatively, the feedback circuit 6 may receive a signal representing the output voltage $V_{OUT}$.

According to one example, the feedback circuit 6 calculates an error signal based on the received output parameter and a reference signal (setpoint signal), wherein the reference signal defines the desired signal level of the output parameter. Further, the feedback circuit 6 may generate the feedback $S_{FB}$ by filtering the error signal using a filter such as a filter having one of a proportional (P) characteristic, an integrating (I) characteristic, a proportional-integrative (PI) characteristic, or a proportional-integrative-derivative (PID) characteristic.

The input voltage $V_{IN}$ may be a direct voltage or a rectified alternating voltage such as a rectified sinusoidal voltage. A rectified alternating voltage may be provided by a bridge rectifier BR (illustrated in dashed lines in FIG. 10) that receives an alternating voltage $V_G$. The alternating voltage $V_G$ is a sinusoidal grid voltage, for example. A frequency of the grid voltage $V_G$ is 50 Hz or 60 Hz, for example, so that a frequency of the rectified grid voltage is 100 Hz or 120 Hz. The switching frequency, that is, the frequency at which the drive cycles are generated is higher than 10 kHz, for example. In this case it can be assumed that the input voltage $V_{IN}$, which affects the delay time duration $T_{DEL}$ changes slowly from one drive cycle to the next drive cycle.

In the power converter shown in FIG. 10, energy is stored in the inductor 2 during the current flow duration $T_{ON}$, that is, during the time period in which the switch current $I_1$ is different from 0. After the electronic switch 1 has been switched off and the switch current $I_1$ has decreased to zero, the energy stored in the inductor 2 is transferred to the output 33, 34, via the rectifier stage II.

Figure 11:
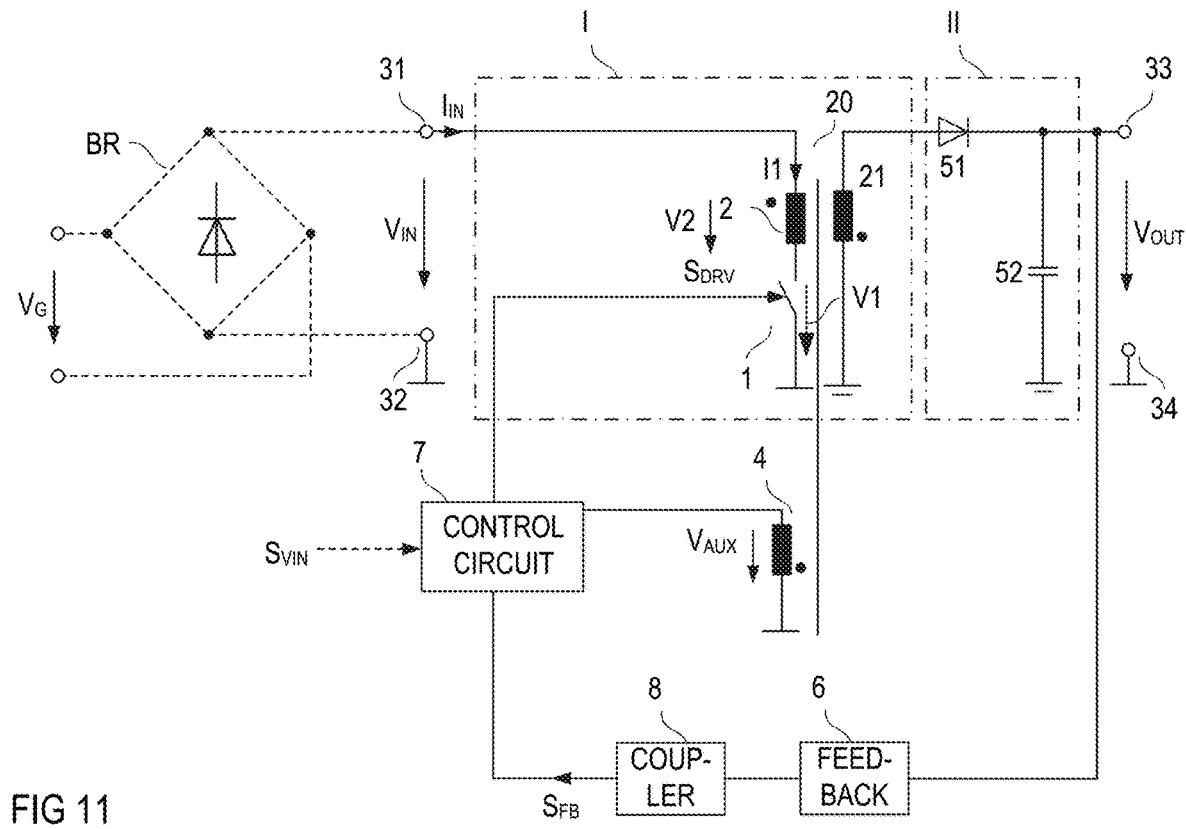
FIG. 11 illustrates one example of a power converter circuit that is implemented as a flyback converter according to embodiments herein.

FIG. 11 shows a power converter according to another example. In this example, the power converter is a flyback converter, wherein the inductor 2 is a primary winding of a transformer 20. A secondary winding 21 of the transformer 20 is inductively coupled with the primary winding 2 and connected to the rectifier stage II. The transformer 20 provides for a galvanic isolation between the input 31, 32 and the output 33, 34 of the power converter. Like in the power converter illustrated in FIG. 10, the inductor 2 is connected in series with the electronic switch 1. Additionally to the feedback circuit 6, the power converter shown in FIG. 11 includes a coupler 8. This coupler 8 is operable to transmit the feedback signal $S_{FB}$ provided by the feedback circuit 6 to the control circuit 7 via a potential barrier formed by the transformer 20. The coupler 8 may include an optocoupler, a capacitive coupler, an inductive coupler, or the like. Couplers of this type are commonly known, so that no further explanations are required in this regard.

In the power converter shown in FIG. 11, energy is stored in the transformer 20 during the current flow duration $T_{ON}$, that is, during the time period in which the switch current $I_1$ is different from 0 and current flows through the primary winding. After the electronic switch 1 has been switched off and the switch current $I_1$ has decreased to zero, the energy stored in the transformer 29 is transferred to the output 33, 34, via the secondary winding 21 and the rectifier stage II.

Figure 12:
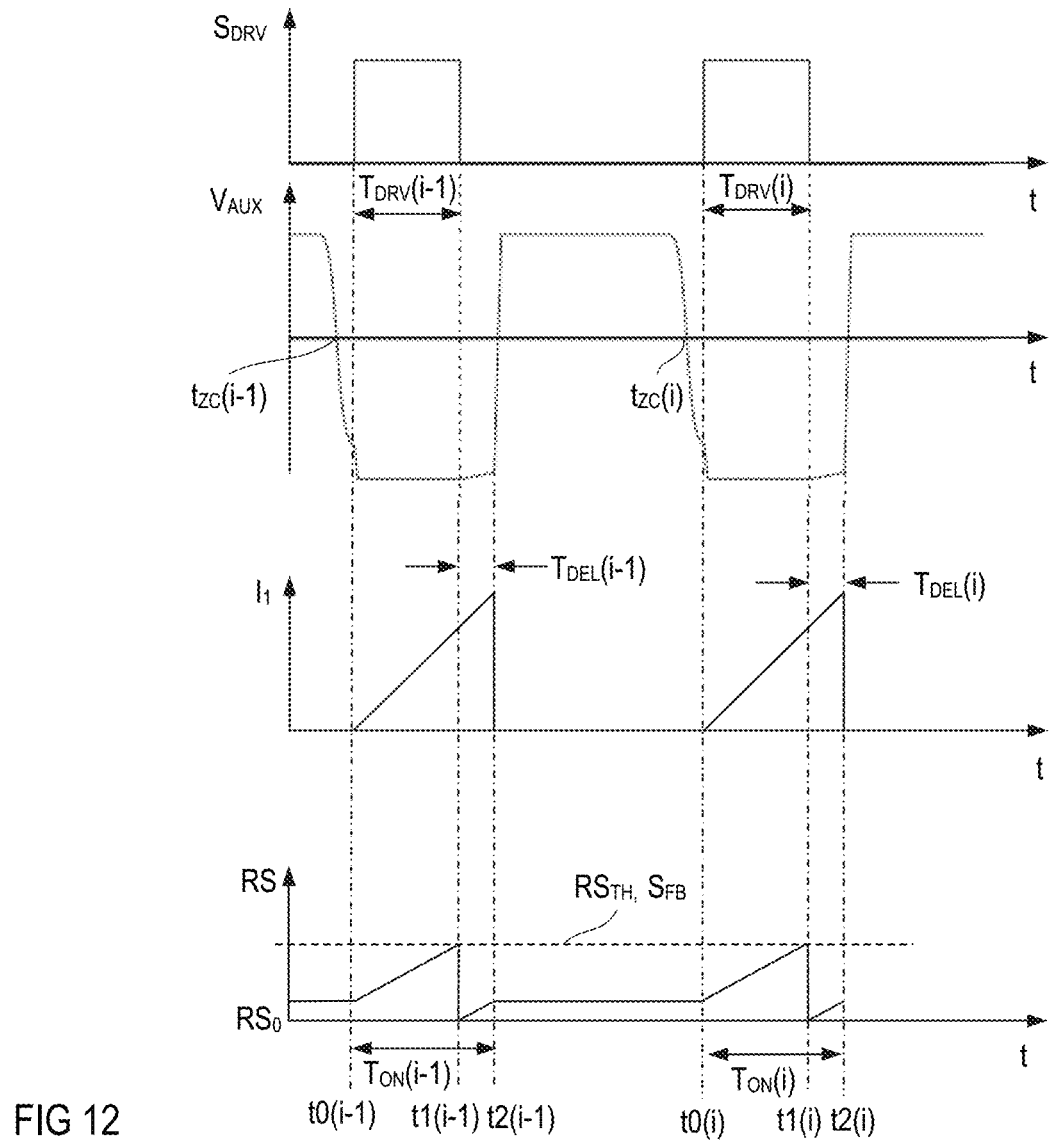
FIG. 12 shows signal waveforms of signal occurring in one of the power converters shown in FIGS. 10 and 11 during operation according to embodiments herein.

One example of a method for operating one of the power converters shown in FIGS. 10 and 11 is illustrated in FIG. 12. FIG. 12 shows signal waveforms of the drive signal $S_{DRV}$, the switch current $I_1$, a ramp signal RS, and an auxiliary voltage $V_{AUX}$. The auxiliary voltage $V_{AUX}$ is a voltage across an auxiliary winding 4 (see FIGS. 10 and 11) that is inductively coupled with the inductor 2. In the example illustrated in FIG. 12, the power converter is operated in a quasi-resonant mode, (may also be referred to as critical conduction mode). In this operating mode, the time instances t0 when a new drive cycle starts are defined by those time instances at which the inductor 2 has been demagnetized. "Demagnetized" means that energy stored in the inductor 2 during the current flow duration $T_{ON}$ has been entirely transferred to the output 33, 34. When the inductor 2 has been demagnetized, a voltage across the inductor 2 is zero. The auxiliary voltage $V_{AUX}$ is proportional to the voltage across the inductor 2 (and in the examples illustrated in FIGS. 10 and 11 has an opposite sign). In the method illustrated in FIG. 12 the auxiliary voltage $V_{AUX}$ is used to detect those time instances $t_{ZC}$ at which the inductor 2 has been demagnetized. These time instances $t_{ZC}$ may also be referred to as zero crossing time instances.

The control circuit 7 is operable to detect the time instances when the auxiliary voltage $V_{AUX}$ reaches zero for the first time after the electronic switch 1 has been switched off and the control circuit 7 may switch on the electronic switch 1 as soon as the auxiliary voltage $V_{AUX}$ reaches zero. According to another example (as illustrated in FIG. 12) the control circuit 7 is operable to switch on the electronic switch 1 when the auxiliary voltage $V_{AUX}$ reaches a first minimum after the first zero crossing time instance $t_{ZC}$. This may help to reduce switching losses. After the voltage across the inductor 2 has crossed zero parasitic oscillations of the voltage V2 across the inductor 2 and, accordingly, of the auxiliary voltage $V_{AUX}$ may incur until the electronic switch 1 switches on for the next time. A period of these oscillations is dependent on an inductance of the inductor 2 and of capacitance values of parasitic capacitances, such as the output capacitance C1 of the electronic switch 1. A period of these parasitic oscillations can be measured or can be obtained by simulations. According to one example, a value representing the duration of one period of these parasitic oscillations is stored in the control circuit 7 and the control circuit 7 is operable to switch on the electronic switch 1 one quarter (¼) period after the auxiliary voltage $V_{AUX}$ has crossed zero for the first time. In this case, the electronic switch 1 switches on when the inductor voltage V2 reaches a first minimum after it has crossed zero.

Further, in the example illustrated in FIG. 12, the desired current flow duration $T_{ON\_DES}$ is proportional to the feedback signal $S_{FB}$ or is given by the feedback signal $S_{FB}$. Thus, the ramp signal threshold $RS_{TH}$ is proportional to the feedback signal $S_{FB}$ or is equal to the feedback signal $S_{FB}$. Thus, the feedback signal $S_{FB}$ defines the desired current flow duration $T_{ON\_DES}$. The feedback signal $S_{FB}$ may be generated by the feedback circuit 6 such that the feedback signal $S_{FB}$ increases as the regulated output parameter ($V_{OUT}$ or $I_{OUT}$) decreases in order to counteract a further decrease of the output parameter, and vice versa.

Referring to the above, the input voltage $V_{IN}$ may be a rectified sinusoidal voltage. In this case, it may be desirable to operate the power converter such that an average of the input current $I_{IN}$ is essentially proportional to the input voltage $V_{IN}$. This can be achieved by operating the power converter in the critical conduction mode and by adjusting the desired current flow duration $T_{ON\_DES}$ dependent on the feedback signal $S_{FB}$, wherein no additional control loop is necessary to achieve the proportionality of input current $I_{IN}$ and input voltage $V_{IN}$. This is commonly known. The method explained herein before in which the delay time $T_{DEL}$ is determined in one drive cycle and the on-level duration $T_{DRV}$ in a next drive cycle is adjusted using the desired current flow duration $T_{ON\_DES}$ and the determined delay time duration in the preceding drive cycle helps to ensure that the actual current flow duration $T_{ON}$ essentially equals the desired flow duration $T_{ON\_DES}$. This is in particular helpful when the instantaneous input voltage $V_{IN}$ is low and the delay $T_{DEL}$ time introduced by the electronic switch 1 is relatively long.

In the example illustrated in FIG. 12, the auxiliary voltage $V_{AUX}$ is not only used to detect zero crossings of the inductor voltage V2 that represent a demagnetization of the inductor 2, but is also used to detect those time instances when the switch current $I_1$ falls below a predefined threshold such as zero. When, at the end of the magnetization period of the inductor 2, the switch current $I_1$ turns to zero, the inductor voltage V2 changes its polarity in a direction that is opposite the direction at the first zero crossing after demagnetization. Consequently, the auxiliary voltage $V_{AUX}$ also changes its polarity. The control circuit 7, according to one example, is operable to detect when the auxiliary voltage $V_{AUX}$ changes its polarity after the signal level of the drive signal $S_{DRV}$ has changed from the on-level to the off-level. The time instance when the auxiliary voltage $V_{AUX}$ changes its polarity is the second time instance t2 at which the delay time duration $T_{DEL}$ ends.

Figure 13:
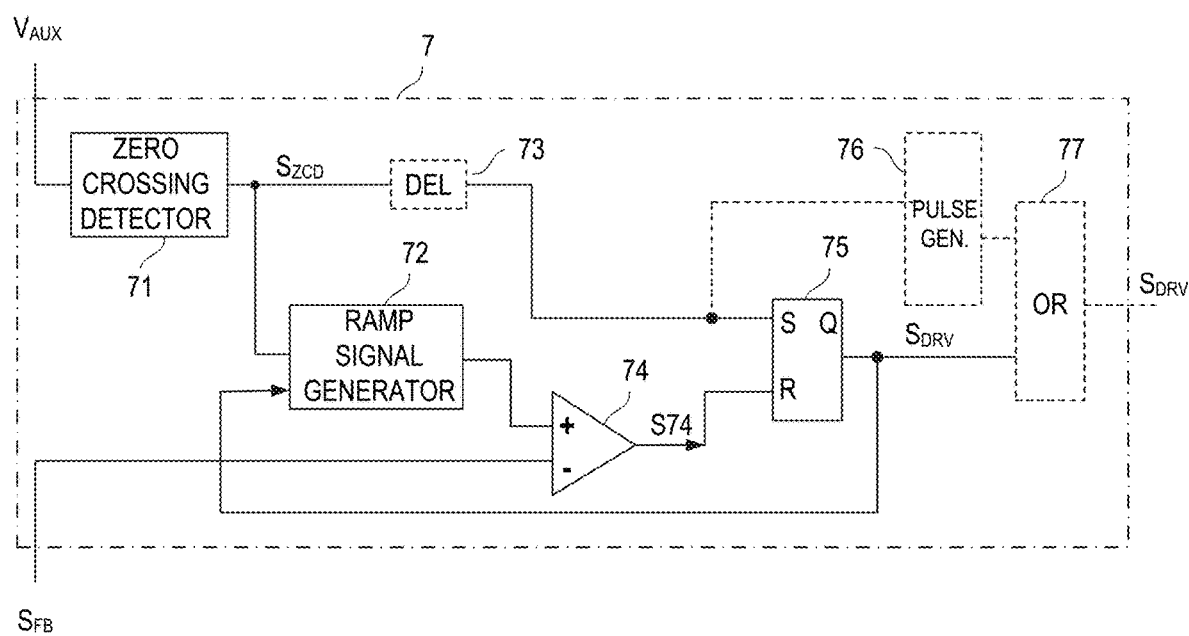
FIG. 13 shows a block diagram of a control circuit shown in FIGS. 10 and 11 according to one example according to embodiments herein.

FIG. 13 shows one example of the control circuit 7 in greater detail. In this example, the control circuit 7 includes a zero crossing detector 71 that receives the auxiliary voltage $V_{AUX}$, a ramp signal generator 72, a comparator 74 and a latch 75 such as an SR flip flop. The ramp signal generator 72 is operable to generate the ramp signal RS governed by a zero crossing detection signal $S_{ZCD}$ generated by the zero crossing detector 71 and the drive signal $S_{DRV}$. The drive signal $S_{DRV}$ is provided by the latch 75 dependent on the zero crossing detection signal $S_{ZCD}$ and a comparator signal S74 generated by the comparator 74. The comparator 74 receives the feedback signal $S_{FB}$ and the ramp signal RS provided by the ramp signal generator 72. In this example, the latch 75 is reset each time the ramp signal RS reaches the feedback signal $S_{FB}$ in order to generate the off-level of the drive signal $S_{DRV}$ to zero. The latch 75 is set in order to generate the on-level of the drive signal $S_{DRV}$ dependent on the zero crossing detection signal $S_{ZCD}$. More specifically, the latch 75 is set each time the zero crossing detection signal $S_{ZCD}$ provided by the zero crossing detector 71 indicates that the auxiliary voltage $V_{AUX}$ has crossed zero in a predefined direction (such as from positive to negative in the example illustrated in FIG. 12). A delay element 73 may cause a delay time between the time instance when the zero crossing detection signal $S_{ZCD}$ indicates that the auxiliary voltage $V_{AUX}$ has crossed zero in the predefined direction and the time instance when the latch 75 is set in order to generate the on-level of the drive signal $S_{DRV}$. A delay time introduced by the delay element 73 may correspond to one quarter of the parasitic oscillation of the inductor voltage V2.

The ramp signal generator 72 is operable to generate the ramp signal RS dependent on the zero crossing detection signal $S_{ZCD}$ and the drive signal $S_{DRV}$ in the way illustrated in FIG. 12. That is, the ramp signal RS is reset to the initial value $RS_0$ each time the drive signal $S_{DRV}$ changes to the off-level and starts to increase beginning at the start level $RS_0$. Further, the ramp signal generator 72 interrupts increasing of the ramp signal RS when the zero crossing detection signal $S_{ZCD}$ indicates that the auxiliary voltage $V_{AUX}$ has crossed zero in a second direction (from negative to positive in the example illustrated in FIG. 12) that is opposite the zero crossing direction that causes the drive signal $S_{DRV}$ to change to the on-level. The ramp signal generator 72 is further operable to again start increasing the ramp signal RS when the drive signal $S_{DRV}$ changes from the off-level to the on-level.

The zero crossing detector 71 may be operable to generate the zero crossing detection signal $S_{ZCD}$ (a) such that the zero crossing detection signal $S_{ZCD}$ changes from a first signal to a second signal level when the auxiliary voltage $V_{AUX}$ crosses zero in the first direction, in order to indicate that the inductor 2 has been demagnetized, and (b) such that the zero crossing detection signal $S_{ZCD}$ changes from the second signal back to the first signal level when the auxiliary voltage $V_{AUX}$ crosses zero in the second direction, in order to indicate that the switch current $I_1$ has decreased to zero.

Detecting the second time instance t2 at which the switch current $I_1$ decreases to zero by monitoring the auxiliary voltage $V_{AUX}$ is only an example. Instead of the auxiliary voltage, the inductor voltage V2, a voltage V1 across the load path of the switch 1, or the switch current $I_1$ may be monitored. Monitoring the switch current $I_1$ may include measuring the switch current $I_1$ using a current sensor (not shown) and comparing a current measurement signal representing the switch current $I_1$ with a suitable threshold signal, such as zero. Monitoring the switch voltage V1 may include measuring the switch voltage V1 and comparing a voltage measurement signal representing the switch voltage V1 with a threshold signal representing the input voltage $V_{IN}$.

The ramp signal generator 72 shown in FIG. 13 may be operable to generate one ramp signal as illustrated in FIG. 12 or may be operable to generate two ramp signals RS11, RS12 of the type illustrated in FIG. 9 wherein these ramp signals are alternatingly generated by the ramp signal generator 72 so that in each drive cycle one of the ramp signals is reset at the first time instance t1 and the other one of the ramp signals starts to increase at the first time instance t1 beginning at the start value $RS_0$.

In the examples explained above, the on-level duration $T_{DRV}$ of the electronic switch 1 is defined by the ramp signal RS in such a way that the on-level duration $T_{DRV}$ is given by a desired current flow duration $T_{ON\_DES}$ minus a delay time duration $T_{DEL}$ determined in a preceding drive cycle. Further, the desired on-time duration $T_{ON\_DES}$ is defined by a ramp signal threshold $RS_{TH}$, wherein this ramp signal threshold $RS_{TH}$ is dependent on the output parameter (e.g., $V_{OUT}$ or $I_{OUT}$) that is to be regulated.

In the method explained above, a scenario may occur in which the ramp signal RS reaches the threshold $RS_{TH}$ during the delay time duration $T_{DEL}$. In this case, the electronic switch 1 remains switched off and switches on again when the threshold signal $RS_{TH}$ increases (e.g., because of a decreasing output voltage $V_{OUT}$) and is no longer equal to the ramp signal RS.

According to another example, the electronic switch 1 is switched on at least for a minimum time period $T_{MIN}$ each time the inductor 2 has been demagnetized. Using a drive circuit 7 of the type illustrated in FIG. 13 this may be achieved by providing a pulse generator 76 that receives the zero crossing detection signal $S_{ZCD}$ from the zero crossing detector 71 or the delay element 73. The pulse generator 76 is operable to output a drive signal pulse having the duration on the minimum time period $T_{MIN}$ each time a zero crossing is detected. A logic gate 77, such as an OR gate, receives the signal pulse from the pulse generator 76 and the output signal from the latch 75, wherein the logic gate 77 provides the drive signal $S_{DRV}$. The drive signal $S_{DRV}$ is governed by the output signal of the latch 75 (a) when the ramp signal RS has not reached the threshold $RS_{TH}$ in the previous drive cycle, so that the latch 75 is reset when the ramp signal RS reaches the threshold $RS_{TH}$ in the instantaneous drive cycle, and (b) when the on-level duration $T_{ON}$ adjusted by comparing the ramp signal RS with the threshold $RS_{TH}$ is longer than the minimum duration $T_{MIN}$. In any other case, that is, either (c) when the ramp signal RS has reached the threshold $RS_{TH}$ in the previous drive cycle, or (d) when the on-level duration $T_{ON}$ adjusted by comparing the ramp signal RS with the threshold $RS_{TH}$ in the instantaneous drive cycle is shorter than the minimum duration $T_{MIN}$, the drive signal $S_{DRV}$ and, therefore, the on-level duration $T_{ON}$ is governed by the output signal of the pulse generator 76.

Figure 14:
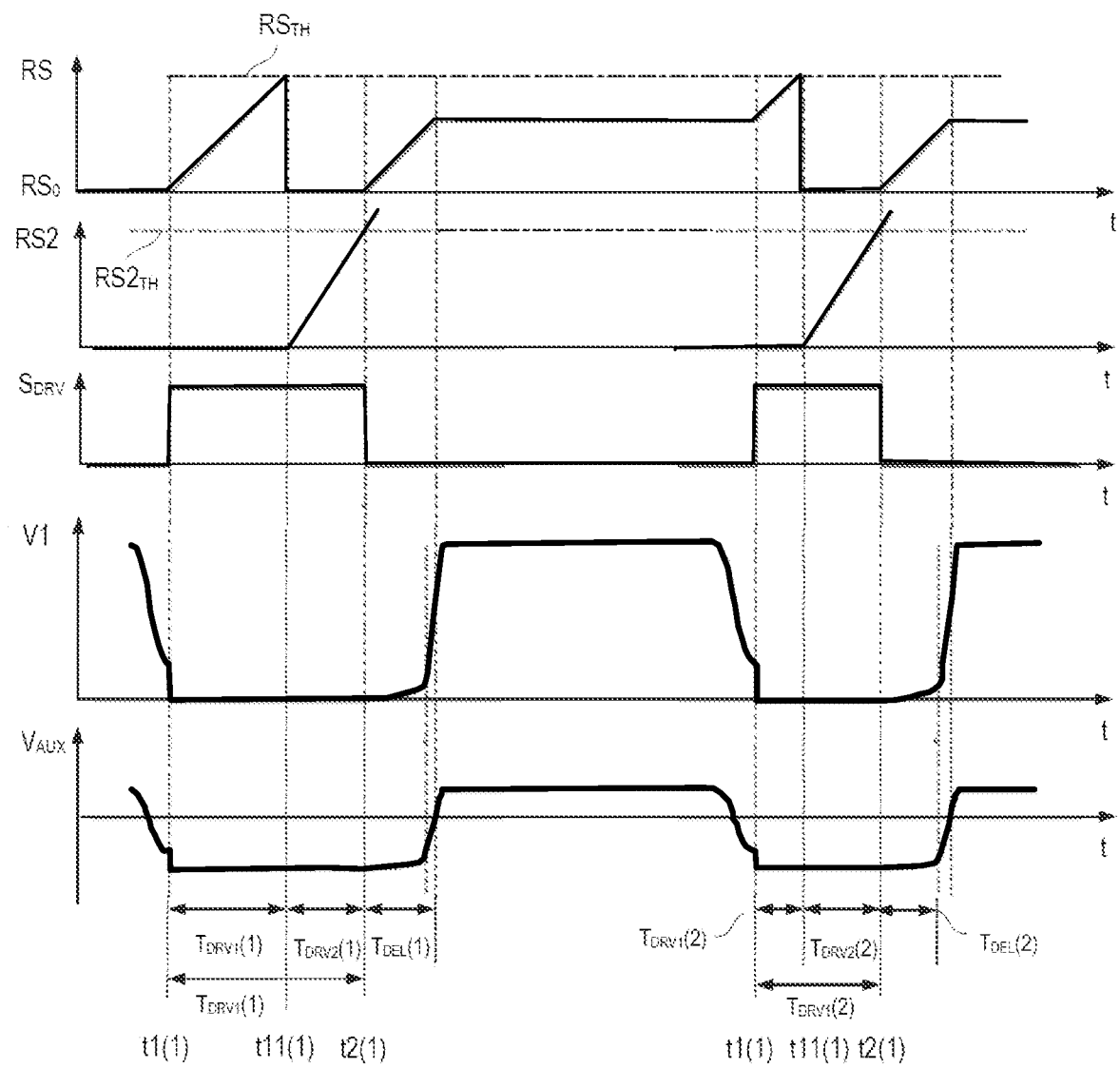
FIGS. 14 to 17 show signal waveforms that illustrate another example of a method in accordance with FIG. 5 according to embodiments herein.

FIG. 14 illustrates a method according to another example. Additionally to the auxiliary voltage $V_{AUX}$, the switch voltage V1 is illustrated in FIG. 14. In this example, the on-level duration $T_{DRV}$ includes a first on-level duration $T_{DRV1}$ that is obtained in the way explained herein before. That is, this first on-level duration $T_{DRV1}$ is given by a time duration represented by a ramp signal threshold $RS_{TH}$ minus a delay time duration $T_{DEL}$ obtained in a preceding drive cycle. Further, the on-level duration $T_{DRV}$ includes a second on-level duration $T_{DRV2}$. This second on-level duration $T_{DRV2}$ is dependent on the input voltage $V_{IN}$ and decreases as the input voltage $V_{IN}$ increases. This second on-level duration $T_{DRV2}$ may help to reduce total harmonic distortion (THD) as explained, for example, in DE 10 2007 035 606 A1 or U.S. Pat. No. 7,683,595 (both to Infineon Technologies Austria AG).

Referring to FIG. 14, the second on-level duration $T_{DRV2}$ may be generated using a further ramp signal RS2, wherein this further ramp signal RS2 starts to increase at a start value $RS2_0$ each time the ramp signal RS has reached its threshold $RS_{TH}$. The ramp signal RS is referred to as first ramp signal, the threshold $RS_{TH}$ is referred to as first ramp signal threshold $RS_{TH}$, the further ramp signal RS2 is referred to as second ramp signal, and a corresponding threshold $RS2_{TH}$ is referred to as second threshold in the following. The second on-level duration $T_{DRV2}$ ends when the second ramp signal RS2 reaches the second threshold $RS2_{TH}$. In this example, the time instance when the second ramp signal RS2 reaches the second ramp signal threshold $RS2_{TH}$ defines the second time instance t2, that is, the time instance when the drive signal $S_{DRV}$ changes from the on-level to the off-level.

Figure 15:
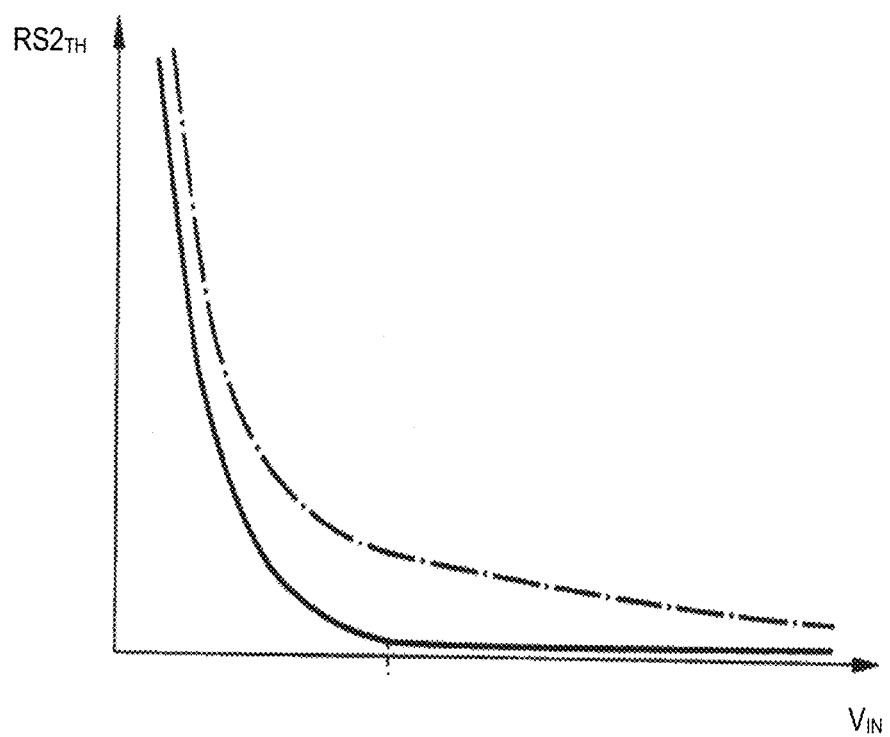

FIG. 15 illustrates one example of a dependency of the second ramp signal threshold $RS2_{TH}$ on the input voltage $V_{IN}$. As can be seen from FIG. 15, the second ramp signal threshold $RS_{TH}$ decreases non-linearly as the input voltage $V_{IN}$ increases. This threshold $RS2_{TH}$ may be generated dependent on the input voltage $V_{IN}$ as explained in the above captioned in DE 10 2007 035 606 A1 or U.S. Pat. No. 7,683,595.

Figure 16:
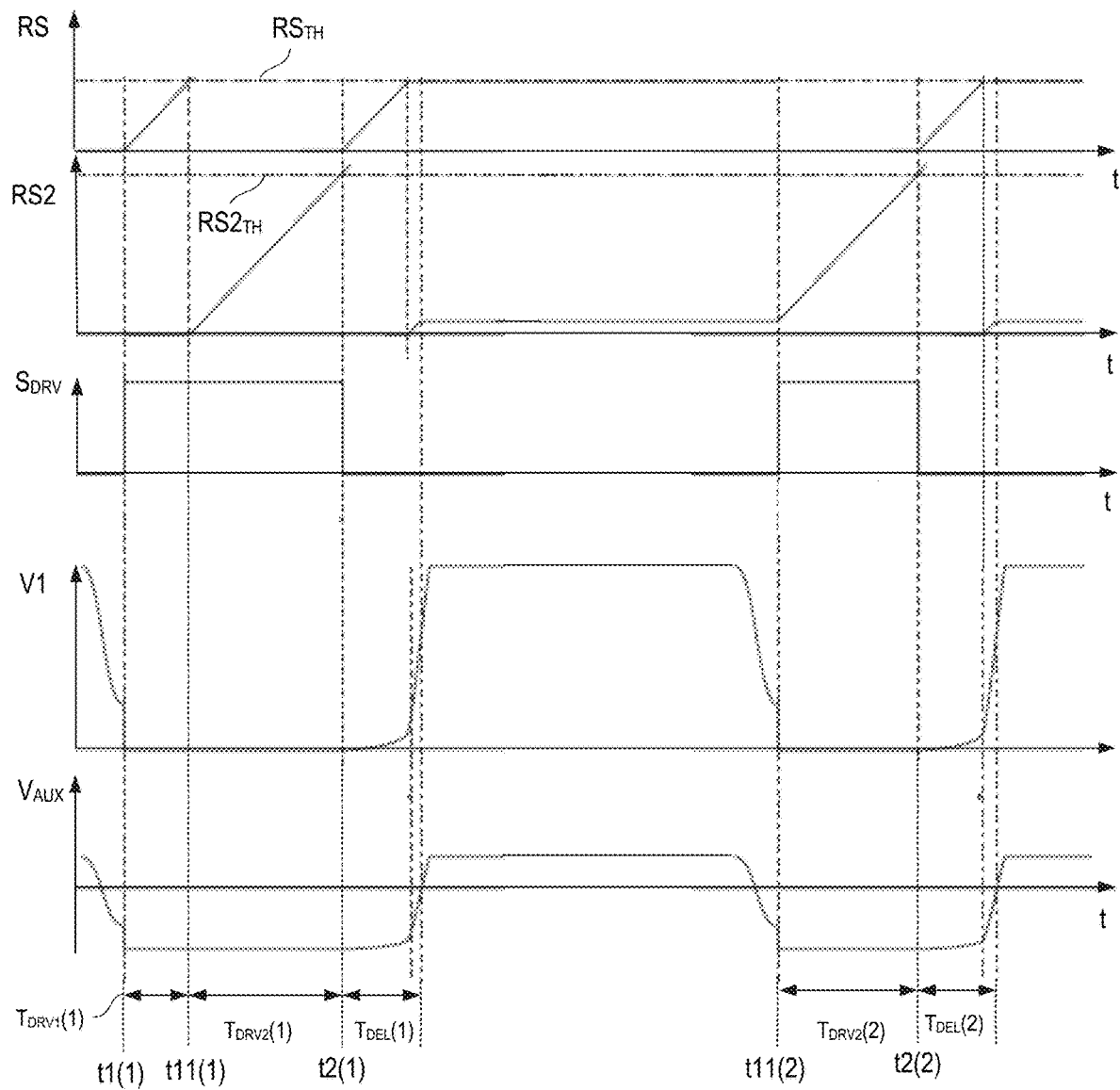
Figure 17:
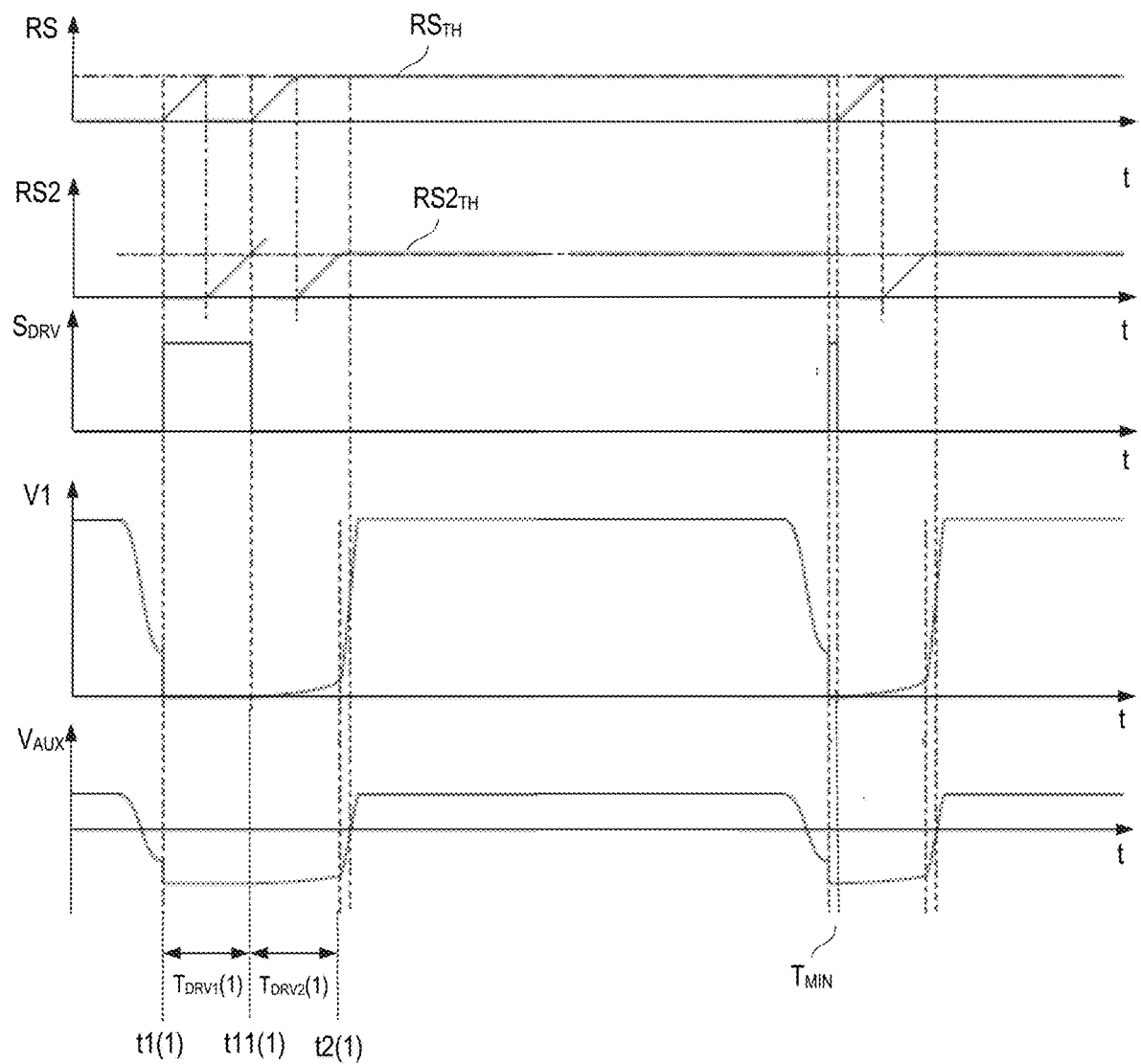

FIGS. 16 and 17 illustrate the method illustrated in FIG. 14 at different levels of the first and second thresholds $RS1_{TH}$, $RS2_{TH}$. As can be seen from FIG. 16, in those cases in which the delay time duration $T_{DEL}$ is relatively long and the second ramp signal threshold $RS2_{TH}$ is relatively high because the input voltage $V_{IN}$ is relatively low the first on-level duration $T_{DRV1}$ may become zero after a very first drive cycle as illustrated in FIG. 16.

FIG. 17 illustrates a scenario, in which both, the first ramp signal RS and the second ramp signal RS2 reach the respective threshold $RS_{TH}$, $RS2_{TH}$ twice in a very first drive cycle. In this example the on-level duration would be zero in the second drive cycle and successive drive cycles. In the example illustrated in FIG. 17, however, the electronic switch 1 is switched on at least for a minimum time period $T_{MIN}$ in each of the drive cycles and independent of the ramp signals RS, $RS2_{TH}$.

The invention claimed is:

1. A method comprising:
   driving an electronic switch, the electronic switch coupled to a first inductor in a power converter,
   wherein driving the electronic switch comprises driving the electronic switch with a drive signal for a plurality of drive cycles,
   wherein driving the electronic switch in the plurality of drive cycles comprises: i) for a first drive cycle of the plurality of drive cycles, determining a desired duration of causing current to flow through the switch; and ii) adjusting a duration of an on-level of the drive signal dependent on the desired duration and a delay time obtained in a preceding drive cycle with respect to the first drive cycle,
   wherein the delay time is a time duration, in the preceding drive cycle, between a first time instance in which the drive signal changes from the on-level to an off-level and a second time instance when a magnitude of the current through the electronic switch falls below a predefined threshold;
   wherein determining the desired duration of the current through the switch for the first drive cycle comprises adjusting a first ramp signal threshold associated with a first ramp signal, and
   wherein adjusting the duration of the on-level of the drive signal dependent on the desired duration and the delay time obtained in the preceding drive cycle comprises: i) starting ramp up of the first ramp signal at the first time instance in the preceding drive cycle and interrupting the ramp up of the first ramp signal at the second time instance in the preceding drive cycle; ii) continuing ramp up of the first ramp signal at a further time instance in the first at drive cycle when the drive signal changes from the off-level to the on-level.

2. The method as in claim 1, wherein adjusting the duration of the on-level of the drive signal includes reducing the time duration of activating the switch in the second control cycle based on the time difference.

3. The method as in claim 1, wherein a magnitude of the first ramp signal is a non-changing ramp magnitude value between the second time instance and the further time instance.

4. The method as in claim 1 further comprising:
   subsequent to the further time instance in the first drive cycle:
      comparing a magnitude of the first ramp signal to the first ramp signal threshold value; and
      deactivating the electronic switch in the second drive cycle in response to detecting that a magnitude of the first ramp signal crosses the first ramp signal threshold value.

5. The method as in claim 1, wherein the second time instance corresponds to occurrence of a zero crossing condition associated with the current through the electronic switch.

6. The method as in claim 1, wherein the magnitude of the current through the first inductor is monitored via an auxiliary signal received from a second inductor magnetically coupled to the first inductor.

7. The method of claim 1,
   wherein the power converter further comprises an auxiliary inductor inductively coupled to the first inductor, and wherein obtaining the delay time in the preceding drive cycle comprises detecting the second time instance based on an auxiliary voltage across the auxiliary inductor.

8. The method of claim 1, wherein obtaining the delay time in the preceding drive cycle comprises detecting the second time instance based on one of:
a first voltage across the electronic switch;
a second voltage across the first inductor; and
a current through the electronic switch.

9. The method of claim 1, wherein adjusting the duration of the on-level of the drive signal further comprises:
changing a magnitude of the drive signal from the on-level to the off-level when the ramp up of the first ramp signal reaches the first ramp signal threshold.

10. The method of claim 9, alternatingly starting ramp up of the first ramp signal and a second ramp signal in successive drive cycles of the plurality of drive cycles.

11. The method of claim 1, wherein adjusting the duration of the on-level of the drive signal further comprises:
detecting a magnetization state of the first inductor and changing a state of the drive signal from the off-level to the on-level based on detecting a predefined magnetization state of the first inductor.

12. The method of claim 11, wherein detecting the magnetization state of the first inductor comprises monitoring a voltage across an auxiliary inductor inductively coupled to the first inductor.

13. The method of claim 1, wherein adjusting the duration of the on-level of the drive signal further comprises:
starting ramp up of a second ramp signal in response to first ramp signal reaching the first ramp signal threshold; and
changing a magnitude of the drive signal from the on-level to the off-level in response to a second ramp signal reaching a second ramp signal threshold.

14. The method of claim 1 further comprising:
adjusting the duration of the on-level of the drive signal to be zero in response to detecting that the desired duration is equal to or shorter than the delay time obtained in the preceding drive cycle.

15. The method of claim 1, wherein adjusting the duration of the on-level of the drive signal dependent on the desired duration and a delay time obtained in the preceding drive cycle further comprises:
adjusting the duration of the on-level of the drive signal to be a predefined minimum duration in response to a difference between the desired duration and the delay time obtained in the preceding drive cycle being smaller than the predefined minimum duration.

16. The method of claim 1, wherein the electronic switch is a superjunction transistor device.

17. The method of claim 1, wherein the predefined threshold is zero.

18. A power converter comprising:
an electronic switch coupled to an inductor; and a control circuit operable to drive the electronic switch in a plurality of drive cycles by a drive signal;
wherein the control circuit is operable, in a first drive cycle of the plurality of drive cycles, to:
determine a desired duration of activating the electronic switch to cause current to flow through the switch; and
adjust a duration of an on-level of the drive signal dependent on the desired duration and a delay time obtained in a preceding drive cycle with respect to the first drive cycle,
wherein the delay time is a time duration between a first time instance in which the drive signal changes from the on-level to an off-level and a second time instance when a magnitude of the current through the electronic switch falls below a predefined threshold,
wherein adjustment of the duration of the on-level of the drive signal dependent on the desired duration and the delay time obtained in the preceding drive cycle comprises:
start ramp up of a first ramp signal at the first time instance in the preceding drive cycle and interruption of ramping up the ramp first ramp signal at the second time instance in the preceding drive cycle;
continue ramp up of the ramp of the first ramp signal at a further time instance in the first drive cycle in response to the drive signal changing from the off-level to the on-level at the further time instance.

19. An apparatus comprising:
a controller operative to:
control a switch for each of multiple control cycles, the switch serially connected to a first inductor in a power converter to convert an input voltage into an output voltage to power a load, a state of the switch controlling a magnitude of current through the first inductor and the switch, the multiple control cycles including a first control cycle followed by a second control cycle;
during the first control cycle of the multiple control cycles, measuring a time difference between a first condition of the controller deactivating the switch and a second condition of a magnitude of the current through the first inductor falling below a current threshold value, the second condition occurring after the first condition; and
adjust a time duration of activating the switch in the second control cycle based on the time difference measured in the first control cycle.

20. The apparatus as in claim 19, wherein the controller is further operative to reduce the time duration of activating the switch in the second control cycle based on the time difference.

21. The apparatus as in claim 19, wherein the controller is further operative to:
start ramp up of a first ramp signal during the first control cycle in response to detecting the first condition;
discontinue ramp up of the first ramp signal in response to detecting the second condition; and
resume ramp up of the first ramp signal in the second control cycle.

22. The apparatus as in claim 21, wherein a magnitude of the first ramp signal is a non-changing ramp magnitude value between a time of the discontinued ramp of the first ramp signal and the resumed ramp up of the first ramp signal.

23. The apparatus as in claim 21, wherein the controller is further operative to, in the second control cycle:
compare a magnitude of the first ramp signal to a threshold value;
deactivate the switch in the second control cycle in response to detecting that the magnitude of the first ramp signal becomes greater than the threshold value.

24. The apparatus as in claim 19, wherein the second condition is a zero crossing condition.

25. The apparatus as in claim 19, wherein the second condition is detected via monitoring an auxiliary signal received from a second inductor magnetically coupled to the first inductor.

\* \* \* \* \*

UNITED STATES PATENT AND TRADEMARK OFFICE
CERTIFICATE OF CORRECTION

PATENT NO. : 11,489,433 B2
APPLICATION NO. : 16/835660
DATED : November 1, 2022
INVENTOR(S) : Martin Feldtkeller Page 1 of 1

It is certified that error appears in the above-identified patent and that said Letters Patent is hereby corrected as shown below:

In the Claims

Claim 1, Line 37, replace "first at" with --first--

Signed and Sealed this
Tenth Day of January, 2023

Katherine Kelly Vidal
*Director of the United States Patent and Trademark Office*